United States Patent [19]

Bauerlein et al.

[11] 3,894,890

[45] July 15, 1975

[54] METHOD FOR IMPROVING THE RADIATION RESISTANCE OF SILICON TRANSISTORS

[75] Inventors: Rudolf Bäuerlein, Erlangen; Dieter Uhl, Uttenreuth, both of Germany

[73] Assignee: Siemens Aktiengesellschaft, Munich, Germany

[22] Filed: July 6, 1973

[21] Appl. No.: 376,937

[30] Foreign Application Priority Data

July 17, 1972 Germany ............ 2235069

[52] U.S. Cl. ............ 148/1.5; 357/91

[51] Int. Cl. ............ H01l 7/54

[58] Field of Search ............ 148/1.5; 317/235

[56] References Cited

UNITED STATES PATENTS

| | | | |
|---|---|---|---|
| 3,448,353 | 6/1969 | Gallagher et al. | 317/235 |
| 3,513,035 | 5/1970 | Fitzgerald et al. | 148/1.5 |
| 3,755,671 | 8/1973 | Lockwood | 148/1.5 X |
| 3,781,612 | 12/1973 | Llacer et al. | 148/1.5 X |

*Primary Examiner*—L. Dewayne Rutledge

*Assistant Examiner*—J. M. Davis

*Attorney, Agent, or Firm*—Kenyon & Kenyon Reilly Carr & Chapin

[57] ABSTRACT

A method for improving the radiation resistance of silicon transistors of the type having silicon oxide cover layer in which a transistor or a silicon wafer with several transistor structures therein is exposed to electron radiation with an energy below 150 keV for a dose of between $10^9$ and $10^{10}$ rad at the boundary layer between the silicon and the silicon oxide cover layer while being at a temperature of between 200° and 300°C. After the irradiation the transistor or silicon wafer is annealed for at least 10 hours at a temperature of between 200° and 300°C while a voltage of at least 0.3 V is applied in the forward direction between the emitter and the base terminal of the transistor or the transistor structures.

12 Claims, 3 Drawing Figures

METHOD FOR IMPROVING THE RADIATION RESISTANCE OF SILICON TRANSISTORS

BACKGROUND OF THE INVENTION

This invention relates to silicon transistors in general and more particularly an improved method of radiation hardening such transistors.

U.S. Pat. application Ser. No. 162,439 filed on July 14, 1971, discloses a method for improving the radiation resistance of silicon transistors which have a silicon oxide cover layer, in which a transistor or a silicon wafer with several transistor structures thereon is exposed to electron irradiation with an energy below 150 keV for a dose of between $10^9$ and $10^{12}$ rad at the boundary layer between the silicon and the silicon oxide cover layer while being kept at a temperature of between 150° and 450°C.

The improvement of the radiation resistance of the transistors obtain by that method results in a drop in the current gain of a treated transistor, when subjected to a test radiation of a predominantly ionizing type of radiation (electron, X-ray, gamma radiation), to a value which is substantially higher than the value to which the current gain of a transistor without treatment drops for the same test irratiation. Current gain is understood to be here the static (d-c) current gain, i.e., the quotient of the collector current and the base current, which is one of the most important characteristics of a transistor. However, the radiation resistance of the transistor is also improved with respect to other characteristics, such as, for example, the cut-off currents and the thermal noise.

An increase in the radiation resistance is of interest particularly in transistors which are to be used in Earth satellites and other space vehicles, and which will be exposed during their employment to the effects of particle and quantum radiation, for example those which will be used in the region of the Earth's radiation belt. In such applications, transistors fail to operate properly as their electrical characteristics are altered by the ionization occurring under the action of the radiation. Specifically, the current gain can decrease considerably under the influence of the radiation. Similar situations may occur in the use of transistors in particle accelerators, nuclear reactors, X-ray installations and other installations where ionizing radiation is produced. In order to prevent excessive degradation of functions in circuits equipped with the transistors, the transistors should therefore have a radiation resistance as high as possible.

In U.S. Pat. application Ser. No. 162,439 an improved method of treatment is disclosed. The transistors are heated only to a temperature of between 150° and 350°C, preferably 200° to 250°C, during irradiation so that the usual transistor sockets and leads may be used during the irradiation. In order to also obtain, in this low temperature range, complete restoration of the radiation damage, the method therein teaches simultaneously applying, during irradiation, an electric voltage in the forward direction between the emitter and the base lead, and optionally, in addition, between the collector and the base lead. This voltage should be as high as possible, but the permissible upper limits of the base and the collector current should not be exceeded. In addition the step of annealing the transistors or silicon wafers after the irradiation for at least 10 hours at between 300° and 350°C, rather than simultaneously applying electrical stress is disclosed.

The method of Pat. application Ser. No. 162,439 results in a considerable increase in the radiation resistance of the treated transistors. Life tests have shown, however, that the improved current gain characteristics of the transistors obtained through treatment is lost after several months storage. In spite of these aging phenomena, the radiation resistance of the transistors treated by the disclosed method is still considerably better than that of the transistors that were not treated at all.

SUMMARY OF THE INVENTION

It is an object of the invention to improve the method disclosed in U.S. Pat. application Ser. No. 162,439 in a manner such that the aging phenomena are prevented to the greatest extent possible even after long-term storage of the transistors.

According to the invention, this problem is solved by applying, when irradiating the transistor or the silicon wafer with several transistor structures thereon, a radiation dose between $10^9$ and $10^{10}$ rad while keeping the transistor or the silicon wafer at a temperature of between 200° and 300°C, and further by annealing the transistor or the silicon wafer after irradiation for at least 10 hours at a temperature of between 200° and 300°C with an electric voltage of at least 0.3 V applied in the forward direction between the emitter and the base terminals of the transistor or each of the transistor structures.

Through the combination of these different process measures the beneficial effects of the method according to the invention are obtained. The choice of the radiation dose of between $10^9$ and $10^{10}$ rad is essential. With irradiation of less than $10^9$ rad a considerable amount of the attainable radiation resistance will subsequently be lost, while with irradiation with more than $10^{10}$ rad the initial values of the current gain present prior to the irradiation frequently can no longer be reached with further treatment. Maintaining the temperature between 200° to 300°C during the irradiation likewise leads to a particularly high radiation resistance. After irradiation at temperatures lower than this, the current gain will be too low after test irradiation. If irradiated at temperature above 300°C it also falls off to lower values than can be obtained with irradiation at temperature of between 200° and 300°C. Annealing at a temperature of between 200° and 300°C for at least 10 hours following the irradiation with electrical stress on the emitter-base junction in the forward direction leads both to the complete restoration of the decrease in the current gain initially caused by the irradiation, if the irradiation conditions mentioned are maintained, and to a complete elimination of the aging effects. An electric voltage of at least 0.3 V is required, as with lower voltages complete restoration will not be achieved. The electric voltage is advantageously chosen to be higher than 0.3 V, but in no case should the highest permissible current limit of the base current be exceeded.

By the additional application of an electric voltage of at leasat 0.3 V in the forward direction between the collector and the base terminal of the transistor or the transistor structure during annealing, again while not exceeding maximum permissible values of the base and the collector current, the properties of the collector-base junction, particularly the breakdown voltage and the cut-off current, can be influenced favorably in the sense of restoring the radiation damage.

If the transistor properties have a wide spread, annealing for at least 40 hours after the irradiation to further avoid aging phenomena is desirable.

The energy of the electron radiation to be applied for the irradiation depends on the thickness of the silicon oxide cover layer of the transistor or the silicon wafer. The energy should be chosen in accordance with the well-known energy-range relation, so that the electron radiation penetrates through the silicon oxide cover layer down into the boundary layer between the silicon oxide cover layer and the silicon. Electron radiation with an energy of more than 150 keV should not be used, since with energies of such magnitude, radiation damage can occur in the interior of the silicon body of the transistor due to dislocation of lattice atoms. With electron beams having an energy of less than 1 keV, it will, as a rule, not be possible to penetrate the silicon oxide cover layer.

DETAILED DESCRIPTION OF THE PREFERRED EMBODIMENT

As an example of an embodiment of the method of the present invention, the treatment of a silicon npn planar transistor (Type BCY 59) will now be explained in detail.

The transistor was first inserted, with the case open or with the cap removed, into a sample holder of a type which can be heated and cooled, and which consisted of a copper plate provided with holes for inserting the transistors. Good thermal contact between the transistor and the copper plate was assured by pressing the base plate of the transistor case firmly against the copper plate. The copper plate was installed in the irradiation chamber of an electron accelerator, which could be evacuated. The emitter, base and connector leads were left open.

After evacuating the irradiation chamber down to a residual gas pressure of about $10^{-4}$ to $10^{-5}$ Torr the transistor was irradiated with electrons having an energy of about 25 keV and a beam current density of about $50\mu a/cm^2$ for about 100 seconds, until a radiation dose of about $5 \cdot 10^9$ rad was reached at the boundary surface between the silicon and the silicon oxide cover layer. The radiation penetrated through the silicon oxide cover layer, which was about 0.2 to 0.5 $\mu m$ thick. During the irradiation the transistor was kept at a temperature of about 250°C by heating the copper plate. After an irradiation period of about 100 seconds, the radiation was turned off. The heating of the plate was then switched off and the copper plate with the transistor thereon was cooled to room temperature. After the irradiation, the transistor was annealed in a vacuum chamber under a vacuum with a residual gas pressure of about $10^{-4}$ to 10hu 5 Torr for about 50 hours at a temperature of about 250°C, while at the same time an electric voltage of about 0.7 V in the forward direction was applied between the base and the emitter terminal and between the base and the collector terminal. After annealing, the transistor was allowed to cool, was cased and the case filled with a protective gas as dry as possible, for example, dry air or dry nitrogen.

Figure 1:
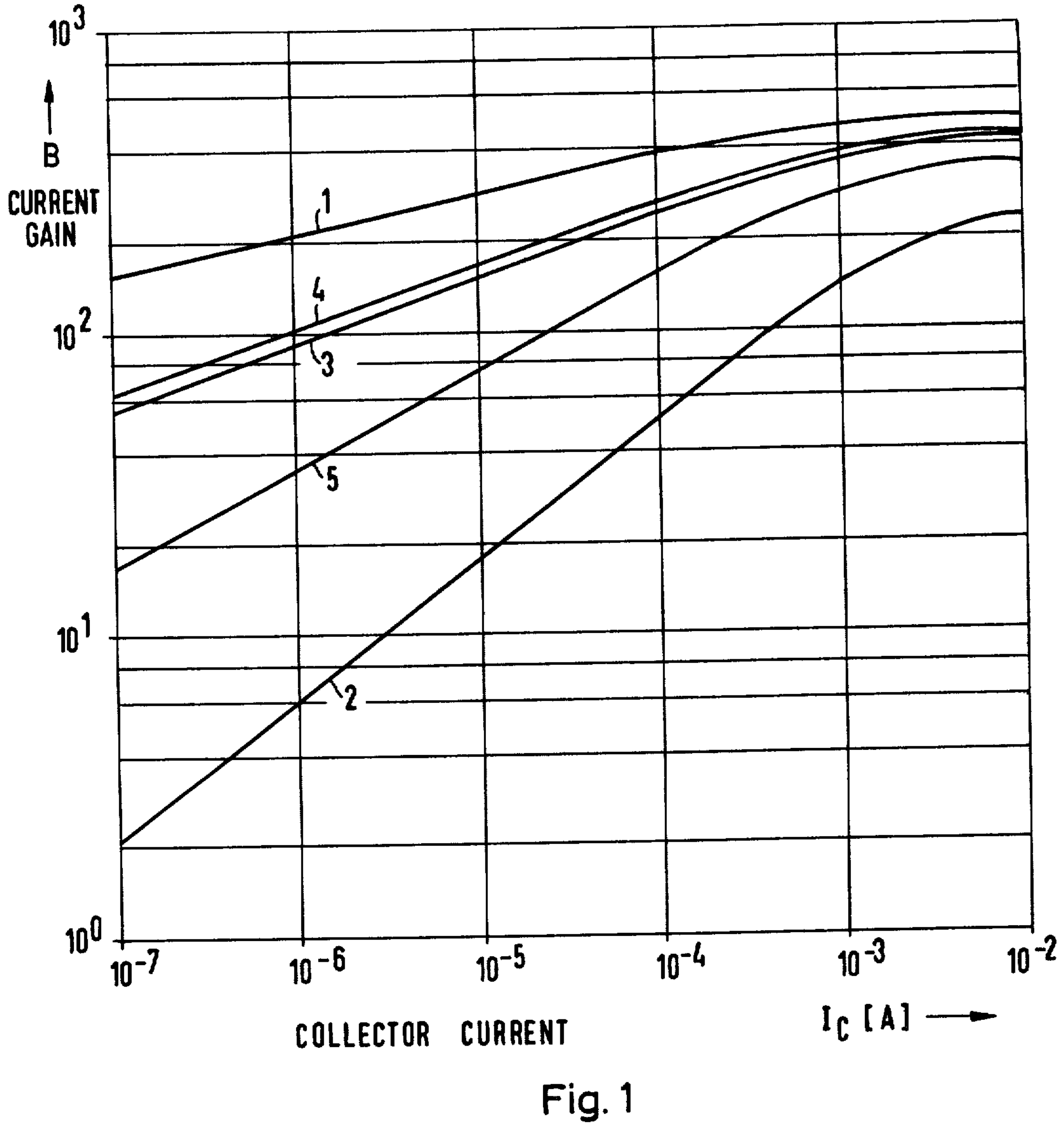
FIG. 1 shows the current gain of silicon npn planar transistors as a function of the collector current before and after treatment by the method according to the invention and after test irradiation, as well as the current gain of corresponding transistors which had been subjected to other treatments for comparison purposes.

The improved radiation resistance of the transistor so treated and the advantages obtained over the method according to the application Ser. No. 162,439 may be seen from FIG. 1. In this figure, the current gain B is plotted on the ordinate and the collector current $I_C$ on the abscissa, both on a logarithmic scale. To obtain the curves 1 to 5, the respective current gain of a transistor was measured for different collector currents.

Prior to treatment according to the method of the invention, the current gain of the transistor was as shown on curve 1. A similar transistor not treated by the method according to the invention was irradiated for comparison purposes with a test dose of $10^7$ rad. In the example described here, the test irradiation was carried out without stressing the test specimens electrically. The current gain dropped from the curve applicable prior to irradiation (curve 1) to the values of curve 2.

The transistor treated as described above, had a current gain after the treatment, i.e., after annealing, which again corresponded to curve 1. The originally observed current gain was therefore not degraded by the treatment. This transistor was now also subjected to a test irradiation with electrons of a dose of $10^7$ rad. The current gain dropped only to the values of curve 3, and therefore was, particularly in the region of smaller collector currents between $10^{-7}$ and $10^{-5}$ amperes, higher by more than a factor 10 than the current gain, given by the curve 2, of the untreated transistor after the same test irradiation.

Even after more than six months' storage at room temperature, the transistors treated by the method according to the invention showed no change in their characteristics. The current gain corresponded, after this length of storage, to the values of the curve 1 in transistors of the corresponding type, and dropped only to the values of curve 3 after the test irrradiation mentioned.

Silicon npn transistors of the same type which, according to Pat. application Ser. No. 162,439, were first subjected to electron radiation having an energy of 25 keW and a dose of about $10^{10}$ rad and kept during the irradiation at a temperature of between 200° and 250°C and to which an electric voltage of about 0.7 V was applied in the forward direction between the emitter-base terminals and between the collector-base terminals, also showed, by comparison, a current gain which initially, after the treatment mentioned, corresponded approximately to the curve 1 and then dropped, after test irradiation, approximately to the curve 3. After three months' storage, however, the current gain of these transistors corresponded only to the values of curve 4 and, after a corresponding test irradiation with electrons of a dose of $10^7$ rad dropped to the values of curve 5. Although the values of this curve 5 are still considerably above the values of curve 2, they are also considerably below those of curve 3. From a comparison of the curves 1 and 3 with the curves 4 and 5, it therefore clearly follows that the stability of the current gain and the radiation resistance of the treated transistors to aging phenomena is substantially improved by the method according to the present invention over the method according to application Ser. No. 162,439.

A further advantage is obtained from the method according to the invention in that the electrical stress of the transistors is not provided during the irradiation, but only during the subsequent annealing. Electrical feethroughs at the irradiation chamber therefore become unnecessary, resulting in considerably simplified operation. Also, a fairly large number of transistors can be irradiated simultaneously without appreciable extra cost.

Curves 1 to 5 relate not only measurements on individual transistors, but were confirmed by investigations with a large number of transistors. Test on pnp silicon planar transistors yielded similar results as the tests on the npn silicon planar transistors.

As the effect of moisture on the transistor surface can lead, as tests have shown, to a degradation of the radiation resistance of the transistor, particularly during the temperature treatment and the following storage, it is advisable to carry out the irradiation as well as the annealing treatment in a vacuum, preferably at a residual gas pressure of $10^{-4}$ to $10^{-5}$ Torr or less, or in a dry protective gas, e.g., dried nitrogen. For the same reason it is furthermore advantageous to put the transistor in a case as soon as possible after annealing and to either fill the case with a carefully dried protective gas, or to evacuate it. A similar protective effect can also be obtained by coating with varnish or plastic, for example, with silicone resin varnish or polyimide, prior to encapsulation or by covering the transistor crystal with a water vapor-repelling plastic, for example, silicone resin. A further possibility is to provide the transistor with a case immediately after the irradiation and to either fill the case with a protective gas or to evacuate it. With this method, no vacuum apparatus is then required for the subsequent annealing treatment. The annealing treatment can be carried out in a standard oven, since the transistor is already surrounded by a dry protective gas inside the case. The electrical stressing of the transistor during the annealing is also simplified considerably, since it is not necessary to bring the corresponding leads into the annealing device in a vacuumtight manner.

Figure 2:
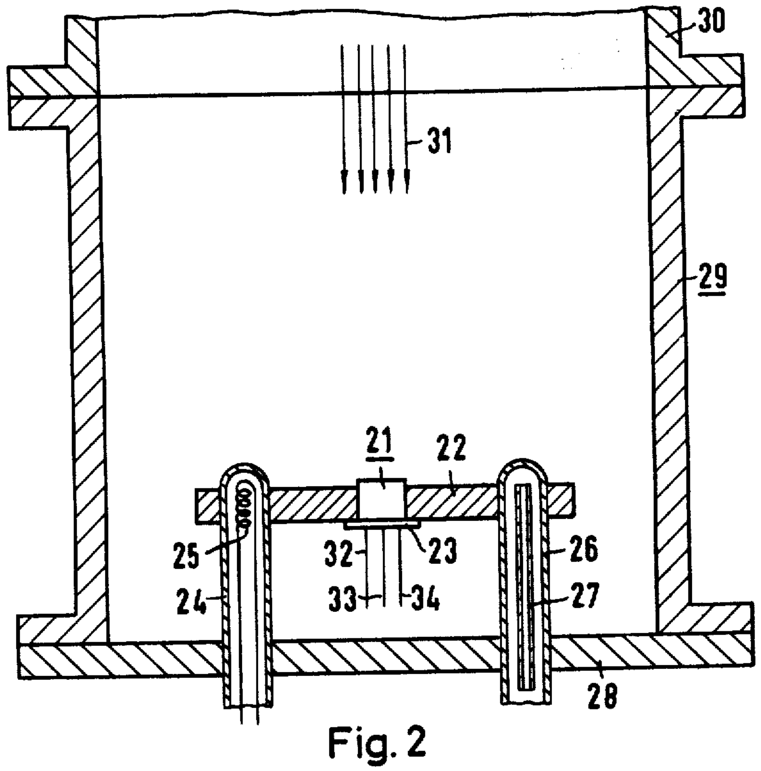
FIGS. 2 and 3 show apparatus for carrying out the method according to the invention.

Apparatus for performing the radiation treatment of the method of the present invention is shown schematically in FIG. 2. As explained above, a silicon npn planar transistor 21 is placed, with its case open, in a mounting which consists of a copper plate 22 provided with a hole. The base plate 23 of the transistor case is pressed firmly against the copper plate 22. For heating the copper plate 22, a tube 24 which is inserted into the copper plate and contains an electrically heated heating helix 25 is provided. A tube 26, which is likewise inserted into the copper plate and which contains a further tube 27 inside is used for cooling the copper plate 22. Through the inner tube 27 coolant can be fed in, for instance, air or water, which can then flow out through the space between the tubes 26 and 27. The tubes 24 and 26 are also used for fastening the copper plate 22 to the base plate 28 of the irradiation chamber 29 of the electron accelerator. The irradiation chamber 29 itself is connected to the end flanges 30 of the electron accelerator, which is not shown in further detail in FIG. 2. The electrons entering the irradiation chamber 29 from the electron accelerator are schematically shown by arrows 31. The emitter lead 32, base lead 33 and collector lead 34 of the transistor 21 are left open.

Figure 3:
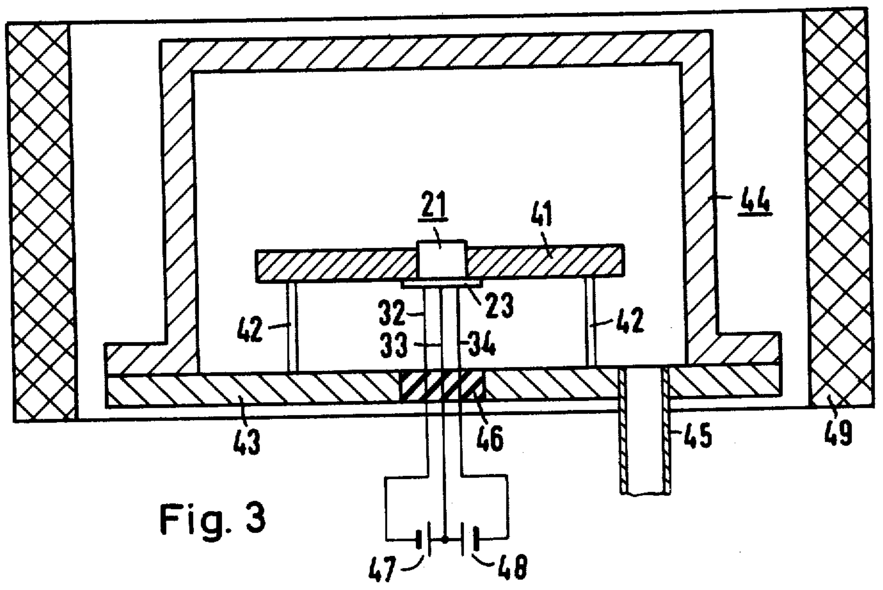

FIG. 3 shows schematically a device for the annealing treatment of the method of the present invention. The transistor 21 is again inserted into a copper plate 41, which is attached to the base plate 43 of a vacuum chamber 44 by means of support rods 42. By means of a pipe connection 45 inserted into the base plate 43, the vacuum chamber 44 can be evacuated. The leads 32, 33 and 34 of the transistor 21 are brought out from the vacuum chamber 44 by means of an insulating feedthrough 46 in a vacuumtight manner. A respective electric voltage in the forward direction can be applied between the emitter lead 32 and the base lead 33 as well as between the collector lead 34 and the base lead 33 of the transistor 21 by means of the d-c sources 47 and 48. An electric resistance furnace 49, which encloses the vacuum chamber 44, is used to heat the vacuum chamber.

The method according to the present invention is suited not only for treating individual silicon planar transistors, but also for treating silicon wafers which contain a large number of transistor structures. If the silicon wafers are to be cut apart and processed further into a large number of transistors and the transistor structures within the silicon wafer are not yet provided with suitable emitter, base and collector leads, the silicon wafers can be first subjected to the irradiation without leads and subsequently cut into individual transistors. These can then be subjected to the annealing treatment under simultaneous electrical stress, after they have been mounted to the base of the housing and contacts have been applied. In attaching them to the base of the housing and applying the contacts, however, the transistors should, as far as possible, not be heated appreciably above 300°C. If, on the other hand, the silicon wafer contains an integrated circuit and if the transistor structures are the transistors of such a circuit, contacts are as a rule applied to the transistor structures prior to the irradiation treatment so that they can be electrically stressed without difficulty during the subsequent annealing treatment of the silicon wafer.

Thus an improved method of treating silicon transistors to resist radiation has been shown. Although specific methods have been described it will be obvious to those skilled in the art that various modifications may be made without departing from the spirit of the invention which is intended to be limited solely by the appended claims.

What is claimed is:

1. A method of improving the radiation resistance of a silicon transistor having a silicon oxide cover layer comprising the steps of:

a. subjecting the transistor to electron radiation with an energy below 150 Kev for a dose of between $10^9$ and $10^{10}$ rad at the boundary layer between the silicon and silicon oxide while maintaining the transistor at a temperature between 200°C and 300°C; and b. after irradiation, annealing the transistor for at least 10 hours at a temperature between 200°C and 300°C while applying an electrical voltage of at least 0.3 V across the emitter and base of the transistor in a forward direction.

2. The method according to claim 1 wherein a plurality of transistors structures on a common wafer are simultaneously processed.

3. The method according to claim 1 and further including the step of applying an electrical voltage of at least 0.3 V across the collector and base of the transistor in the forward direction during annealing.

4. The method according to claim 1 wherein the step of annealing is continued for at least 40 hours.

5. The method according to claim 1 wherein the steps of irradiation and annealing are performed with the transistor in a vacuum.

6. The method according to claim 1 and further including the step of enclosing the transistor in an airtight capsule after annealing, said capsule being filled with a dry protective gas.

7. The method according to claim 1 and further including the step of covering the transistor with a plastic coating after annealing.

8. The method according to claim 1 and further including the steps of coating the transistor crystal with a coat of one of lacquer and plastic and then placing said crystal in a capsule.

9. The method according to claim 1 and further including the step of encapsulating the transistor in an air-tight capsule between the steps of irradiating and annealing which capsule is filled with a dry protective gas.

10. The method according to claim 1 wherein the steps of a irradiation and annealing are performed with the transistor in a dry protective gas.

11. The method according to claim 1 and further including the step of enclosing the transistor in an evacuated airtight capsule after annealing.

12. A method according to claim 1 and further including the step of encapsulating the transistor in an evacuated air-tight capsule between steps of irradiating and annealing.

* * * * *

UNITED STATES PATENT AND TRADEMARK OFFICE

CERTIFICATE OF CORRECTION

PATENT NO. : 3 894 890

DATED : July 15, 1975

INVENTOR(S) : RUDOLF BÄUERLEIN

It is certified that error appears in the above-identified patent and that said Letters Patent are hereby corrected as shown below:

In column 3, line 67, change " $10^{-4}$ to $10^{-}hu^{5}$" to --$10^{-4}$ to $10^{-5}$--

Signed and Sealed this

*thirtieth* Day of *December 1975*

[SEAL]

*Attest:*

RUTH C. MASON
*Attesting Officer*

C. MARSHALL DANN
*Commissioner of Patents and Trademarks*